(12) United States Patent
Choi et al.

(10) Patent No.: US 9,549,455 B2
(45) Date of Patent: Jan. 17, 2017

(54) DISPLAY PANEL AND METHOD OF MANUFACTURING THE SAME

(71) Applicant: SAMSUNG DISPLAY CO., LTD., Yongin, Gyeonggi-Do (KR)

(72) Inventors: Min-Hee Choi, Hwaseong-si (KR); Hyun-Chol Bang, Seongnam-si (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 212 days.

(21) Appl. No.: 14/452,948

(22) Filed: Aug. 6, 2014

(65) Prior Publication Data

US 2015/0049409 A1 Feb. 19, 2015

(30) Foreign Application Priority Data

Aug. 14, 2013 (KR) .................. 10-2013-0096287

(51) Int. Cl.
| | |
|---|---|
| *H02H 9/00* | (2006.01) |
| *H05F 3/00* | (2006.01) |
| *H01J 11/44* | (2012.01) |
| *H05K 9/00* | (2006.01) |
| *G02F 1/1362* | (2006.01) |

(52) U.S. Cl.
CPC ............... *H05F 3/00* (2013.01); *H01J 11/44* (2013.01); *H05K 9/0079* (2013.01); *G02F 1/136204* (2013.01); *Y10T 29/49155* (2015.01)

(58) Field of Classification Search
CPC ...................................................... H05F 3/00
USPC .......................................................... 361/220
See application file for complete search history.

(56) References Cited

U.S. PATENT DOCUMENTS

| | | | |
|---|---|---|---|
| 6,525,786 B1 * | 2/2003 | Ono ................ | G02F 1/13452 349/141 |
| 8,373,827 B2 * | 2/2013 | Hsu ................ | G02F 1/133514 349/106 |
| 2005/0212789 A1 | 9/2005 | Kim | |
| 2009/0309477 A1 | 12/2009 | Bang et al. | |

FOREIGN PATENT DOCUMENTS

| | | |
|---|---|---|
| KR | 10-2005-0094540 A | 9/2005 |
| KR | 10-2008-0061923 A | 7/2008 |
| KR | 10-2009-0129312 A | 12/2009 |
| KR | 10-1092500 B1 | 12/2011 |
| KR | 10-2012-0030724 A | 3/2012 |
| KR | 10-2012-0136270 A | 12/2012 |

* cited by examiner

*Primary Examiner* — Stephen W Jackson
(74) *Attorney, Agent, or Firm* — Lee & Morse, P.C.

(57) ABSTRACT

A display panel is provided including a first substrate, an upper structure, and a first conductive pattern. The first substrate may include an upper surface and a lower surface on opposite sides of the first substrate, the upper and lower surfaces facing away from each other. The upper structure may be on the upper surface of the first substrate. A first conductive pattern layer may be on the lower surface of the first substrate. The first conductive pattern layer may be configured to absorb and discharge static electricity input from outside the display panel.

20 Claims, 12 Drawing Sheets

DISPLAY PANEL AND METHOD OF MANUFACTURING THE SAME

CROSS-REFERENCE TO RELATED APPLICATION

The present application claims priority under 35 U.S.C. §119 to Korean Patent Application No. 10-2013-0096287, filed on Aug. 14, 2013, in the Korean Intellectual Property Office, and entitled: "Display Panel and Method of Manufacturing The Same," which is incorporated by reference herein in its entirety.

BACKGROUND

1. Field

Embodiments relate generally to a display device configured to discharge static electricity and a method of manufacturing the display panel.

2. Description of the Related Art

A display device may include a display panel having a plurality of pixels that are formed on a substrate. To increase a resolution of the display panel, a size of the pixels may be reduced, and a size of internal elements included in the display panel also may be reduced. However, when a size of the internal elements is reduced, the internal elements are sensitive to a static electricity input from outside. For example, because a substrate of the display panel includes insulating materials, the static electricity may directly damage the internal elements of the display panel.

SUMMARY

A display panel may include a first substrate, an upper structure on an upper surface of the first substrate, and a first conductive pattern layer on a lower surface of the first substrate, where the first conductive pattern layer absorbs and discharges a static electricity input from outside. The first substrate may include an upper surface and a lower surface on opposite sides of the first substrate, the upper and lower surfaces facing away from each other. The upper structure may include a plurality of organic light emitting devices.

The first conductive pattern layer may include a metal. The first conductive pattern layer may include a transparent conductive material. The first conductive pattern layer may include a conductive polymer. The first conductive pattern layer may include a metal nanowire. The first conductive pattern layer may include a plurality of polygonal patterns that are separate from each other. The first conductive pattern layer may include a plurality of circular patterns that are separate from each other. The first conductive pattern layer may include a plurality of linear patterns that are separate from each other. The first conductive pattern layer may include a plurality of dot patterns that are separate from each other. The first conductive pattern layer may include at least one lattice pattern that is formed by crossing a plurality of first linear patterns arranged in a first direction and a plurality of second linear patterns arranged in a second direction.

The display panel may further include a second conductive pattern layer on a lower surface of the first conductive pattern layer, where the second conductive pattern layer absorbs and discharges the static electricity, and an insulating layer between the first conductive pattern layer and the second conductive pattern layer. The insulating layer may electrically insulate the first conductive pattern layer and the second conductive pattern layer from each other. The first conductive pattern layer and the second conductive pattern layer may include substantially identical patterns. The first conductive pattern layer and the second conductive pattern layer may include substantially different patterns.

A method of manufacturing a display panel may include a step of forming a first conductive pattern layer on a lower surface of a first substrate, where the first conductive pattern layer absorbs and discharges a static electricity input from outside, and a step of forming an upper structure on an upper surface of the first substrate. The first conductive pattern layer may be formed by forming a first conductive layer on a lower surface of the first substrate, and patterning the first conductive layer. The first conductive pattern layer may be formed by a printing process using a first conductive material. The method of manufacturing the display panel may further include a step of forming an insulating layer on a lower surface of the first conductive pattern layer, and a step of forming a second conductive pattern layer on a lower surface of the first conductive pattern layer, where the second conductive pattern layer absorbs and discharges the static electricity. The second conductive pattern layer may be formed by forming a second conductive layer on a lower surface of the insulating layer, and patterning the second conductive layer. The second conductive pattern layer may be formed by printing process, using a second conductive material.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
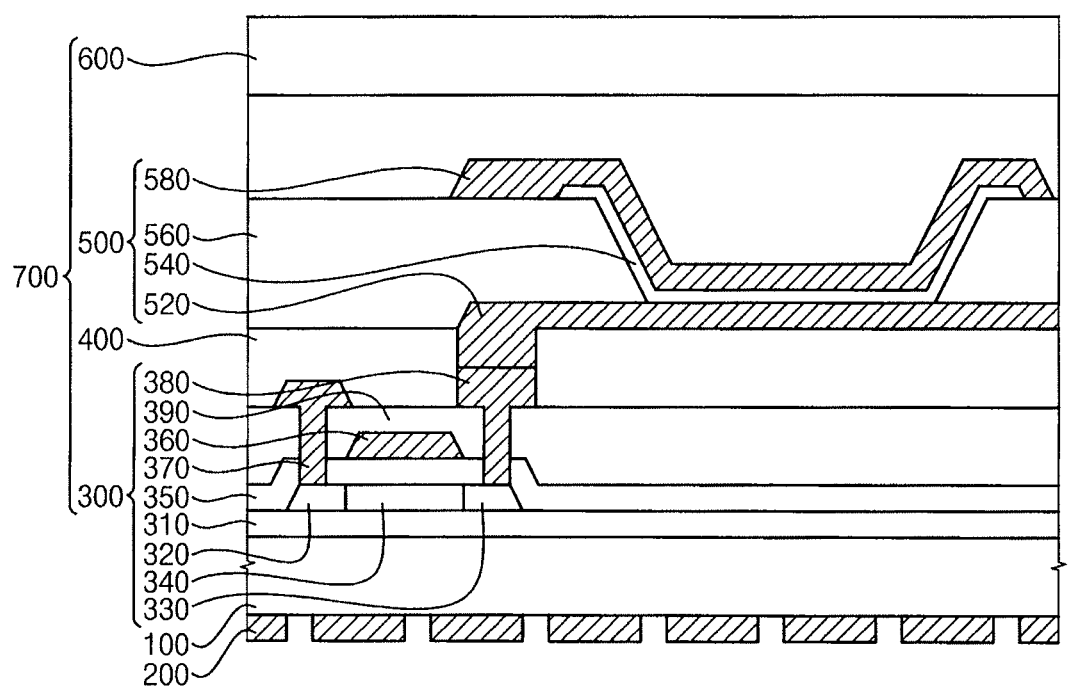
FIG. 1 illustrates a cross-sectional view of a display panel.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

It will be understood that, although the terms first, second, third, and the like may be used herein to describe various elements, these elements should not be limited by these terms. These terms are used to distinguish one element from another. Thus, a first element discussed could be termed a second element without departing from the teachings of the present disclosure. As used herein, the term "and/or" includes any and all combinations of one or more of the associated listed items. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," and the like).

The terminology used herein is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view illustrating a display panel. Referring to FIG. 1, the display panel 10 may include a first substrate 100, an upper structure 700 on an upper surface of the first substrate 100, and a first conductive pattern layer 200 on a lower surface of the first substrate 100. For example, the display panel 10 may be a display panel applied to a flat display device. The display panel 10 may be an organic light emitting display (OLED) panel, a liquid crystal display (LCD) panel, a plasma display panel (PDP), or an electrophoresis display panel. Because it is illustrated in FIG. 1 that a display element 500 of respective pixels included in the display panel 10 is an organic light emitting diode, the display panel 10 may correspond to the OLED panel.

The first substrate 100 may be a base substrate of the display panel 10. The first substrate 100 may be an inorganic substrate including a glass, a poly-silicon, or the like. The first substrate 100 may be a plastic substrate including a polyethylene terephthalate (PET), a polyethylene naphthalate (PEN), a polyimide, or the like. The first substrate 100 may be a flexible display substrate if the first substrate 100 includes a conductive material such as a metal having flexibility, other polymers having flexibility, or the like.

The upper structure 700 may be on an upper surface of the first substrate 100. The upper structure 700 may include major elements of the display panel 10. "An upper surface" means a surface on which the upper structure 700 is located with respect to the first substrate 100. "A lower surface" means an opposite surface to the upper surface. Therefore, although it is illustrated in some drawings that the element is on an upper surface of the first substrate 100, the element may be substantially on a lower surface of the first substrate 100 when the element is on an opposite surface of the upper surface on which the upper structure 700 is located. The upper structure 700 may include the display element 500, a switching element 300, and a second substrate 600 covering the switching element 300 and the display element 500.

The switching element 300 may be coupled to the display element 500. For example, the switching element 300 may be a thin film transistor (TFT) including a low temperature poly-silicon (LTPS) that is formed on the first substrate 100 including a glass at a predetermined temperature lower than 600° C. For example, the switching element 300 may be a TFT including poly-silicon or the like. The switching element 300 may be directly on an upper surface of the first substrate 100. As illustrated in FIG. 1, the switching element 300 may be on a buffer layer 310 covering the first substrate 100. The buffer layer 310 may improve a flatness of the first substrate 100. The buffer layer 310 may relieve a stress on the first substrate 100, where the stress may occur during a process of forming the switching element 300 on the first substrate 100, and may block impurities diffused from the first substrate 100. For example, the buffer layer 310 may include at least one of an oxide, a nitride, and an oxynitride.

A semiconductor layer 320, 330 and 340 may be on the buffer layer 310. The semiconductor layer 320, 330 and 340 may include a first impurity area 320, a second impurity area 330, and a channel area 340. When the switching element 300 includes a TFT, for example, the TFT may be a P-type TFT or an N-type TFT according to a kind of impurity included in the first impurity area 320 and the second impurity area 330. The first impurity area 320 and the second impurity area 330 may function as a source area of the TFT and a drain area of the TFT, respectively. The semiconductor layer 320, 330 and 340 may include a poly-silicon, a poly-silicon having an impurity, an amorphous silicon, an amorphous silicon having an impurity, or a combination thereof.

The gate insulation layer 350 may function to electrically separate the semiconductor layer 320, 330 and 340 from a gate electrode 360. The gate insulation layer 350 may include an oxide or an organic insulating material. For example, the gate insulation layer 350 may include at least one of a silicon oxide, an aluminum oxide ($AlO_x$), a titanium oxide ($TiO_x$), a benzo-cyclo-butene (BCB)-based resin, an acryl-based resin, and the like. The gate electrode 360 may be on an upper surface of the gate insulation layer 350 to be substantially overlapped with the semiconductor layer 320, 330, and 340. The gate electrode 360 may include a metal, a metal nitride, a conductive metal oxide, a transparent conductive material, or the like. The gate electrode 360 may have a mono-layered structure or a multi-layered structure including the metal, the metal nitride, the conductive metal oxide, and/or the transparent conductive material.

An insulating interlayer 390 may on the upper surface of the first substrate 100 to cover the gate electrode 360 and the gate insulation layer 350. The insulating interlayer 390 may include an oxide, a nitride, an oxynitride, an organic insulating material, or a combination thereof. The insulating interlayer 390 may include holes exposing portions of the first impurity area 320 and the second impurity area 330 of the semiconductor layer 320, 330 and 340. A source electrode 370 and a drain electrode 380 that are electrically connected to the first impurity area 320 and the second impurity area 330, respectively through the holes may be on the insulating interlayer 390. Each of the source electrode 370 and the drain electrode 380 may include at least one of a metal, a metal nitride, a conductive metal oxide, a transparent conductive material, and the like. The source electrode 370 and the drain electrode 380 may have a mono-layered structure or a multi-layered structure including the metal, the metal nitride, the conductive metal oxide, and/or the transparent conductive material.

The upper structure 700 may further include a planarization layer 400 covering the switching element 300. The planarization layer 400 may include a transparent insulating material such as a transparent plastic, a transparent resin, or the like. For example, the planarization layer 400 may include a benzo-cyclo-butene-based resin, an olefin-based resin, a polyimide-based resin, an acrylic-based resin, a polyvinyl-based resin, a siloxane-based resin, or a combination thereof. The planarization layer 400 may have a substantially flat surface provided by a planarization process. For example, the planarization layer 400 may be planarized by a chemical mechanical polishing (CMP) or an etch-back. The planarization layer 400 may include a material having a self-planarizing property.

The upper structure 700 may include a display element 500 electrically connected to the switching element 300. As illustrated in FIG. 1, the display element 500 may be an organic light emitting diode including an organic light emitting layer 540. The display element 500 may include a first electrode 520 electrically connected to the switching element 300, a second electrode 580 opposite to the first electrode 520, and an organic light emitting layer 540 between the first electrode 520 and the second electrode 580. The display element 500 may further include organic layers such as a hole injection layer, a hole transport layer, an electron transport layer, an electron injection layer, or the like that are between the first electrode 520 and the second electrode 580. The display element 500 may further include a pixel definition layer 560 surrounding the organic light emitting layer 540. The display element 500 may be a liquid crystal display element including a pixel electrode, a liquid crystal, a common electrode, and a color filter, may be illuminated by a back-light unit. The display element 500 may be a plasma display element including, for example, an address electrode, a phosphor layer, a dielectric layer, a scan electrode, and a sustain electrode.

The upper structure 700 may include a second substrate 600 covering the switching element 300 and the display element 500. The second substrate 600 may protect the switching element 300 and the display element 500 from an ambient environment. To protect the switching element 300 and the display element 500, the second substrate 600 may have physical and chemical stability, and to have improved transmittance for visible light to transmit a light emitted by the display element 500. The display element 500 may emit light through the second substrate 600 to be viewed by a viewer. The second substrate 600 may include at least one of a glass, a transparent metal film, an organic insulating film, and an inorganic insulating film, or the like.

The first conductive pattern layer 200 may be on a lower surface of the first substrate 100. The first conductive pattern layer 200 may prevent the display panel 10 from being damaged by a static electricity. Many types of damages of display panel 10 due to the static electricity may exist. One example of the damages of the display panel 10 is that the switching element 300 or the display element 500 is electrically damaged by electrostatic discharge (ESD). For example, when the display element 500 is a liquid crystal display element, a bad pixel may be caused by destroying an arrangement of the liquid crystal by ESD. Another example of damages of the display panel 10 is that a dust sticks on the first substrate 100 by the static electricity. If the dust sticks on the switching element 300 or a wire connected to the switching element 300, the dust may result in a short circuit. If the dust sticks on the gate insulation layer 350 or the insulating interlayer 390, the dust may damage thereof.

Generally, to protect the display panel 10 from the static electricity, an additional static protective device for protecting the display panel 10 from the static electricity may be used in the display panel 10. However, in such a case, an additional space for disposing the additional static protective device may be used, and an additional wire for transferring the static electricity to the additional static protective device may also be used. For example, in case of a big-size display panel 10, a quantity of the additional static protection devices may be increased. Accordingly, the additional space and additional wires may also be used. Thus, according to such a case, a method for manufacturing the display panel 10 may be more difficult and an efficient protection of the display panel 10 from the static electricity might not be achieved.

According to present embodiments, the display panel 10 may include the first conductive pattern layer 200 that can absorb and discharge the static electricity input from outside. The first conductive pattern layer 200 may include a conductive material. The first conductive pattern layer 200 may protect the switching element 300 or the display element 500 by absorbing the static electricity on behalf of the switching element 300 or the display element 500, and by discharging the static electricity. The first conductive pattern layer 200 may have a predetermined pattern shape in order to efficiently absorb and discharge the static electricity. For example, the first conductive pattern layer 200 may include a plurality of patterns having a predetermined shape.

FIGS. 2 through 6 illustrate plan views illustrating some exemplary pattern shapes of a first conductive pattern layer included in the display panel of FIG. 1. Referring to FIGS. 2 through 6, the first conductive pattern layer 220, 240, 260, 280, and 290 may include patterns 222, 242, 262, 282, 292, and 294, respectively. As illustrated in FIGS. 2 through 6, the patterns 222, 242, 262, 282, 292, and 294 may have various shapes. The patterns 222, 242, 262, 282, 292, and 294 may partially cover the lower surface of the first substrate 100. An exposing portion 224, 244, and 262 may expose the lower surface of the first substrate 100. Thus, a height difference between the portion in which the patterns 222, 242, 262, 282, 292, and 294 are located and the exposing portion 224, 244, and 262 may exist, and the static electricity may be absorbed efficiently by the height difference. The patterns 222, 242, 262, 282, 292, and 294 may have various cross-section shapes. For example, the patterns 200 may have a quadrangular cross-section shape as illustrated in FIG. 1. For example, the patterns 222, 242, 262, 282, 292, and 294 may have a semi-circular cross-section shape, a triangular cross-section shape or a trapezoidal cross-section shape, or the like. For example, when the patterns 222, 242, 262, 282, 292, and 294 have a sharp triangular cross-section shape, the static electricity may be easily concentrated on a vertex of the sharp triangle. The static electricity may be easily absorbed by the patterns 222, 242, 262, 282, 292, and 294.

The first conductive pattern layer 220, 240, 260, 280, and 290 may include a conductive material having a low resistance to easily absorb the static electricity. For example, the first conductive pattern layer 220, 240, 260, 280, and 290 may include a metal such as copper (Cu), aluminum (Al), platinum (Pt), silver (Ag), gold (Au), chromium (Cr), tungsten (W), molybdenum (Mo), titanium (Ti), palladium (Pd), or the like, or a combination thereof. For example, when the first conductive pattern layer 220, 240, 260, 280, and 290 includes a combination of the metals, the first conductive pattern layer 220, 240, 260, 280, and 290 may include a silver-copper-silver (ACA) alloy or a silver-palladium-copper alloy. The first conductive pattern layer 220, 240, 260, 280, and 290 may have a mono-layered structure or a multi-layered structure including the metal and/or a combination of the metals. The first conductive pattern layer 220, 240, 260, 280, and 290 may include a transparent conductive material. For example, the first conductive pattern layer 220, 240, 260, 280, and 290 may include an indium zinc oxide (IZO), an indium tin oxide (ITO), a gallium tin oxide, a zinc oxide ($ZnO_x$), a gallium oxide ($GaO_x$), a tin oxide ($SnO_x$), an indium oxide ($InO_x$), or a combination thereof. When the first conductive pattern layer 220, 240, 260, 280, and 290 includes a transparent conductive material, for example, the display panel 10 may be applied to a transparent display device or a duplex display device. The first conductive pattern layer 220, 240, 260, 280, and 290 may include a conductive polymer. For example, the first conductive pattern layer 220, 240, 260, 280, and 290 may include a poly-3,4-ethylenedioxythiophene/poly(styrenesulfonate) (PEDOT/PSS), a polyanilne, a polyacetylene or a polyphenylene-vinylene (PPV). The display panel 10 may be used for a flexible display device. The conductive pattern layer 220, 240, 260, 280, and 290 may include a metal nanowire. For example, the metal nanowire may be a silver nanowire. The first conductive pattern layer 220, 240, 260, 280, and 290 may have not only transparency but also flexibility. The display panel 10 may be used for a transparent flexible display device.

Figure 2:
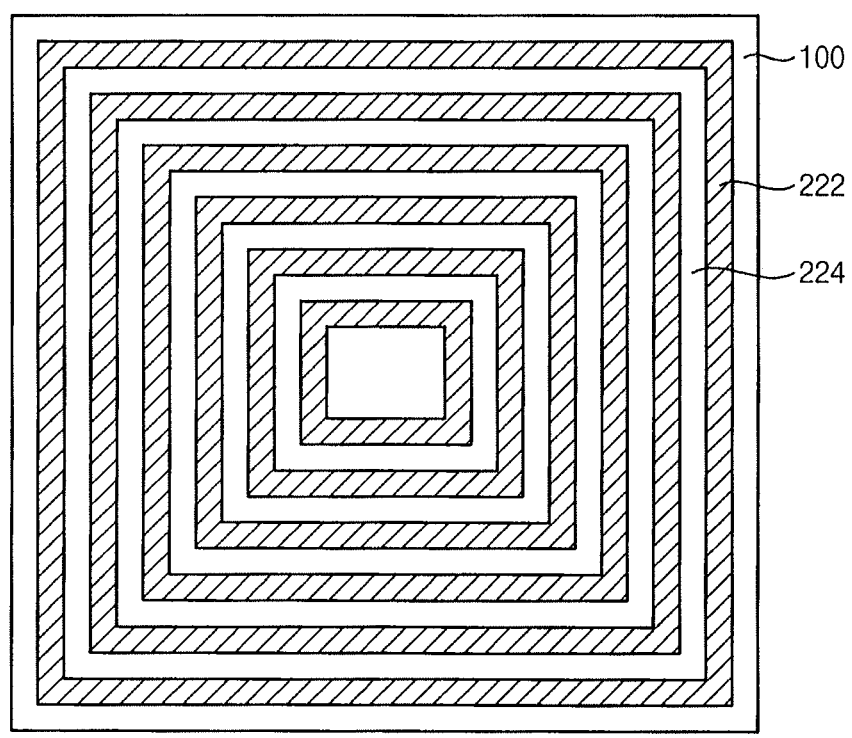
FIGS. 2 through 6 illustrate plan views of some exemplary pattern shapes of a first conductive pattern layer included in the display panel of FIG. 1.

The first conductive pattern layer 220 may include a plurality of polygonal patterns 222, which may be concentric. For example, the polygon may be a quadrangle, as illustrated in FIG. 2. The polygonal patterns 222 may be located so as not to be overlapped each other. That is, the polygonal patterns 222 may be located to be separate from each other. The exposing portion 224 may be between the polygonal patterns 222. The static electricity may be absorbed into the polygonal patterns 222, and then the static electricity may be discharged by dispersing along sides of the polygonal patterns 222. To absorb the static electricity efficiently, the polygonal patterns 222 may be positioned densely on the first substrate 100 to cover substantially the overall surface of the first substrate 100.

Figure 3:
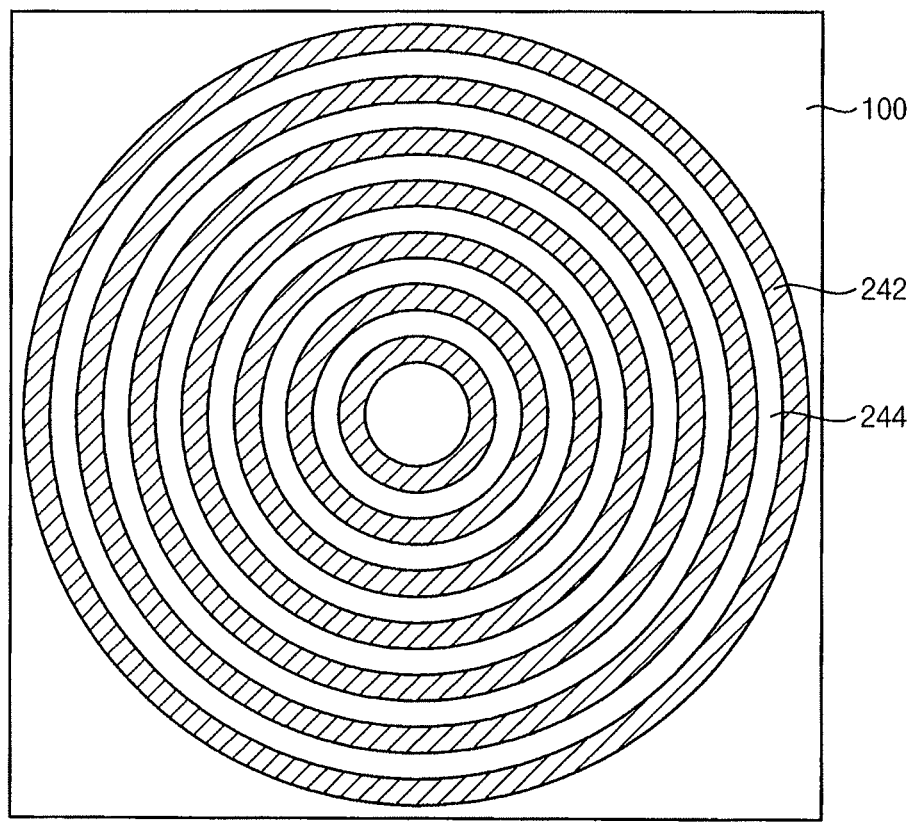

The first conductive pattern layer 240 may include a plurality of circular patterns 242. For example, the circular patterns 242 may be concentric circles that are separate from each other, as illustrated in FIG. 3. In this case, the exposing portion 244 may be between the circular patterns 242. The static electricity may be absorbed into the circular patterns 242, and then the static electricity may be discharged by dispersing along sides of the circular patterns 242. To absorb the static electricity efficiently, the circular patterns 242 may be positioned densely on the first substrate 100 to cover substantially the overall surface of the first substrate 100.

Figure 4:
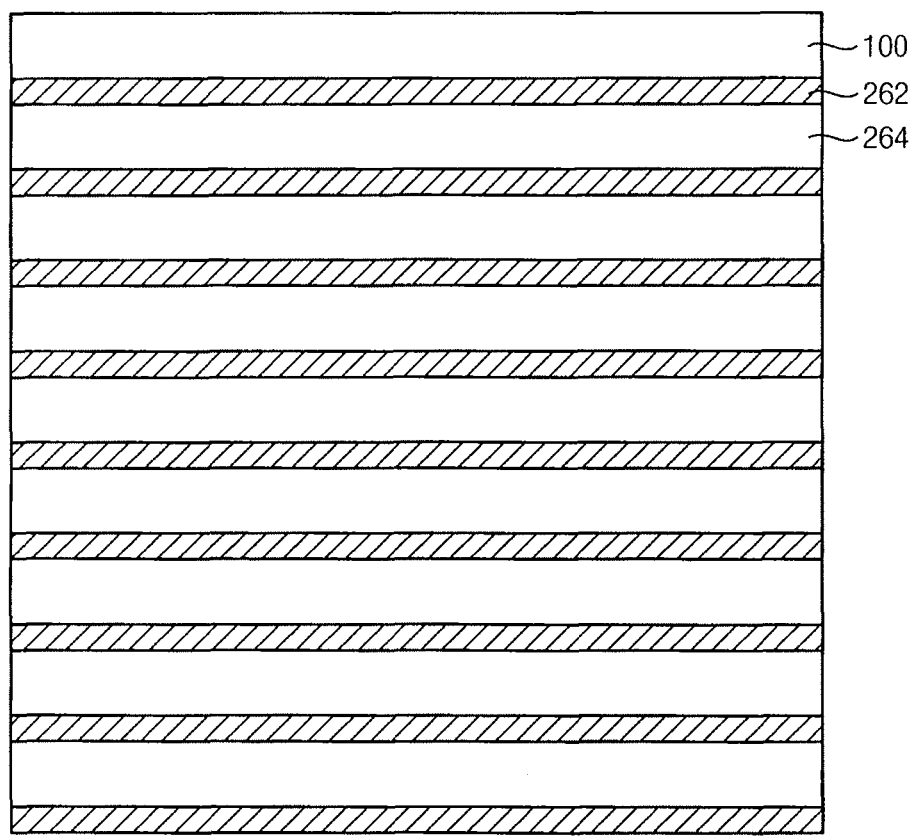

The first conductive pattern layer 260 may include a plurality of linear patterns 262, as illustrated in FIG. 4. For example, the linear patterns 262 may be positioned so as to be parallel to a side of the first substrate 100. The linear patterns 262 may be positioned so as not to be overlapped each other. The linear patterns 262 may be separate from each other. The exposing portion 264 may be between the linear patterns 262. The static electricity may be absorbed into the linear patterns 262, and then the static electricity may be discharged by dispersing along the linear patterns 262. To absorb the static electricity efficiently, the linear patterns 262 may be positioned densely on the first substrate 100 to cover substantially the overall surface of the first substrate 100.

Figure 5:
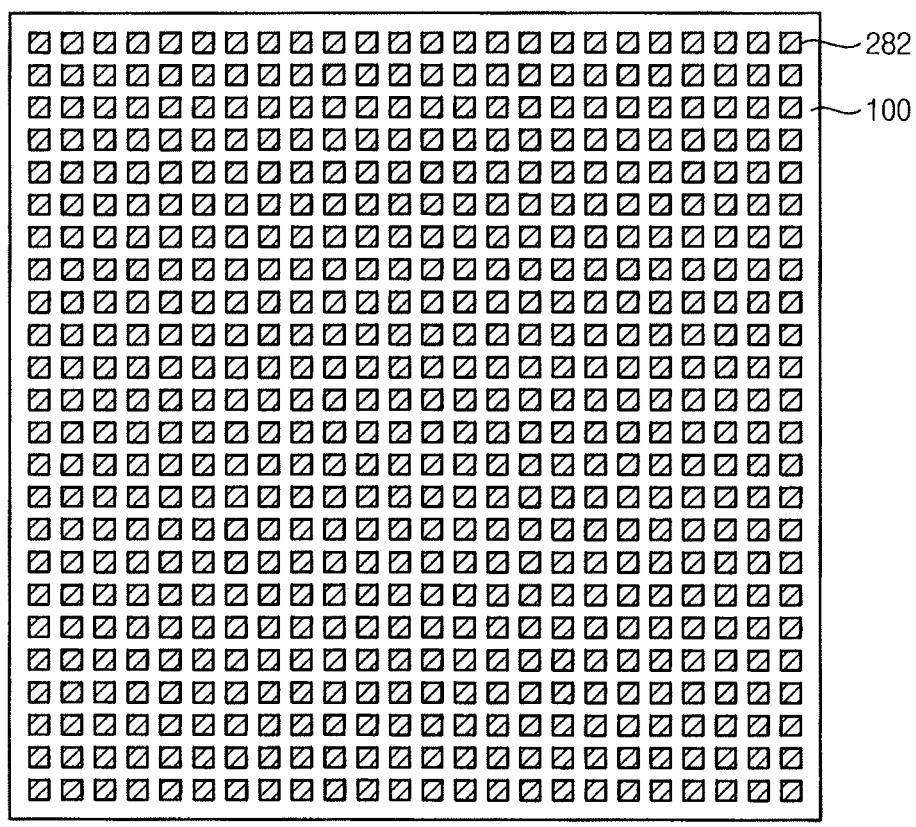

The first conductive pattern layer 280 may include a plurality of dot patterns 282 that protrudes from the lower surface of the first substrate 100, as illustrated in FIG. 5. The dot patterns 282 may be positioned densely on the first substrate 100 to cover substantially overall surface of the first substrate 100. To absorb the static electricity efficiently, the dot patterns 282 may have a triangular pyramid shape or a quadrangular pyramid shape.

Figure 6:
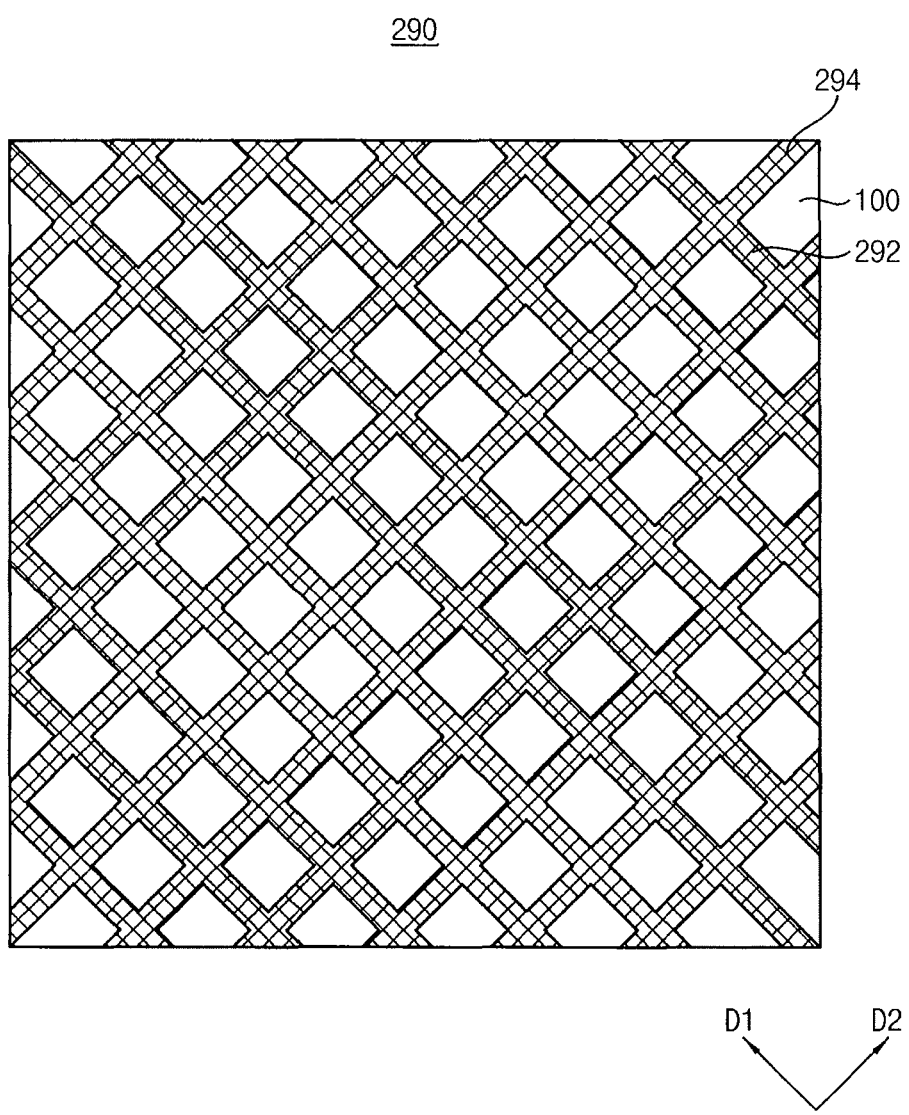

The first conductive pattern layer 290 may include a plurality of a first linear patterns 292 arranged in a first direction D1 and a plurality of a second linear patterns 294 arranged in a second direction D2. The first direction D1 may be perpendicular to the second direction D2. For example, as illustrated in FIG. 6, the first direction D1 may be a diagonal direction across a surface of the first substrate 100, and the second direction D2 may be another diagonal direction perpendicular to the first direction D1. For example, the first direction D1 may be a direction parallel to a side of the first substrate 100, and the second direction D2 may be another direction perpendicular to the first direction D1. The first direction D1 may be at an acute angle or an obtuse angle to the second direction D2. In this case, the first linear patterns 292 and the second linear patterns 294 may form lattice patterns by crossing each other. The lattice patterns can disperse an absorbed static electricity to various directions. The static electricity may be discharged efficiently. To absorb the static electricity efficiently, the first linear patterns 292 and the second linear patterns 294 may be positioned densely on the first substrate 100 to cover substantially the overall surface of the first substrate 100.

The display panel 10 may include the first conductive pattern layer 220, 240, 260, 280, and 290 that has patterns 222, 242, 262, 282, 292, and 294 having various predetermined shapes to absorb and discharge the static electricity. The display panel 10 may have improved durability against the static electricity. The first conductive pattern layer 220, 240, 260, 280, and 290 may absorb the static electricity that can be applied to the upper structure 700, such that the first conductive pattern layer 220, 240, 260, 280, and 290 may protect safely the switching element 300 and the display element 500 from the static electricity.

Figure 7:
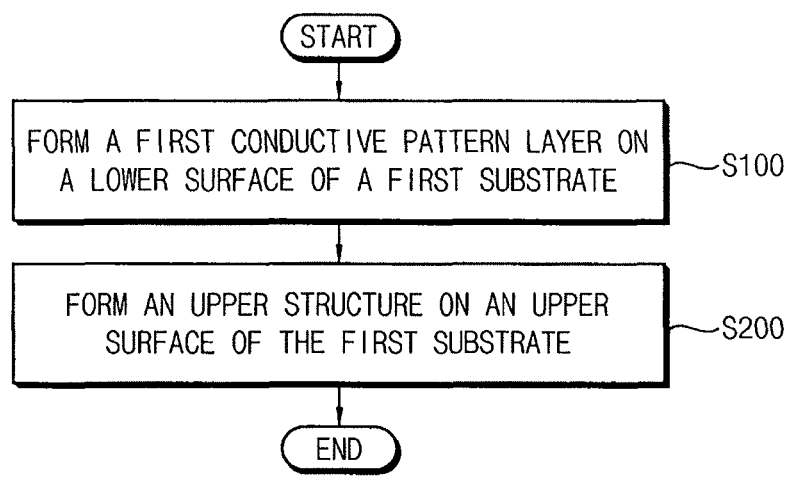
FIG. 7 is a flow chart of a method of manufacturing a display panel.

FIG. 7 is a flow chart of a method of manufacturing a display panel. FIGS. 8A through 8D illustrate cross-sectional views illustrating the method of FIG. 7. Referring to FIG. 7 and FIGS. 8A through 8D, the method of FIG. 7 may be used to manufacture the display panel 10. The method of FIG. 7 may form a first conductive pattern layer 200 on a lower surface of a first substrate 100 (S100), and may form an upper structure 700 on an upper surface of the first substrate 100 (S200).

Figure 8A:
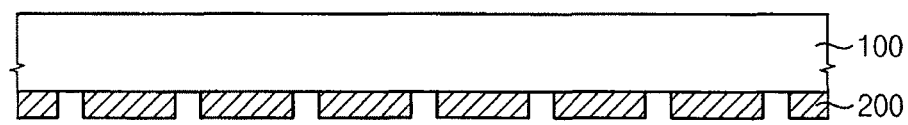
FIGS. 8A through 8D illustrate cross-sectional views of the method of FIG. 7.

As illustrated in FIG. 8A, the method of FIG. 7 may form the first conductive pattern layer 200 on the lower surface of the first substrate 100. The first conductive pattern layer 200 may be formed with a metal, a transparent conductive material, a conductive polymer or a metal nanowire or a combination thereof, that are described herein with reference to FIGS. 2 through 6. The method of FIG. 7 may form the upper structure 700 on an upper surface of the first substrate 100. For example, the upper structure 700 may include a switching element 300 and a display element 500. The upper structure 700 may further include various devices.

Figure 8B:
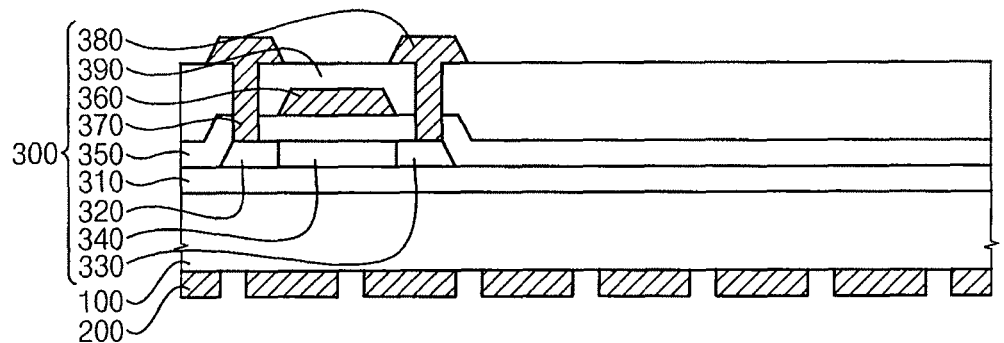

As illustrated in FIG. 8B, the method of FIG. 7 may form the switching element 300 on the upper surface of the first substrate 100. For example, when the switching element 300 is a top-gate type TFT, the method of FIG. 7 may form a buffer layer 310 on the upper surface of the first substrate 100, and the method of FIG. 7 may form a semiconductor layer 320, 330, and 340 on the buffer layer 310, and the method of FIG. 7 may form a gate insulation layer 350 to cover the semiconductor layer 320, 330 and 340, and the method of FIG. 7 may form a gate electrode 360 to cover a channel area 340 of the semiconductor layer 320, 330, and 340, on the gate insulation layer 340, and the method of FIG. 7 may form an insulating interlayer 390 to cover the gate electrode 360, and the method of FIG. 7 may form a source electrode 370 and a drain electrode 380 to penetrate into the insulating interlayer 390 and the gate insulation layer 350.

The buffer layer 310 may be formed with an oxide, a nitride or an organic insulating material, or the like. The buffer layer 310 may be formed by a deposition, a coating process, a thermal oxidation process, a printing process, or the like. The buffer layer 310 may be formed on substantially the overall upper surface of the first substrate 100. The semiconductor layer 320, 330 and 340 may be formed by a deposition, a coating process, a printing process, or the like, using a silicon, for example. The gate insulation layer 350 may be formed by a deposition, a sputtering process, a coating process, a printing process, or the like, using an oxide or an organic insulating material, for example. The gate electrode 360 may be formed by a deposition, a sputtering process, a coating process, a printing process, or the like, using a metal or a transparent conductive material, for example. A first impurity area 320 and a second impurity area 330 may be formed by using the gate electrode 360 as a mask. For example, the first impurity area 320 and the second impurity area 330 may be formed by injecting an impurity by an ion implantation process. A gate line may be formed on a side of the gate insulation layer 350 while the gate electrode 360 is formed. The gate line may be formed by a substantially the same method as the method of forming the gate electrode 360. The insulating interlayer 390 may be formed to cover the gate electrode 360. The insulating interlayer 390 may be formed by a sputtering process, a deposition, a coating process, a printing process, or the like, using an oxide, a nitride or an organic insulating material, for example.

After forming holes exposing portions of the first impurity area 320 and the second impurity area 330 by partially etching the insulating interlayer 390 and the gate insulation layer 350, the source electrode 370 and the drain electrode 380 to fill the holes may be formed. The source electrode 370 and the drain electrode 380 may be formed by a deposition, a sputtering process, a coating process, a printing process, or the like, using a metal or a transparent conductive material, for example. A data line may be formed on a side of the insulating interlayer 390 while the source electrode 370 and the drain electrode 380 are formed. The data line may be formed by substantially the same method as the method of forming the source electrode 370 and the drain electrode 380.

Figure 8C:
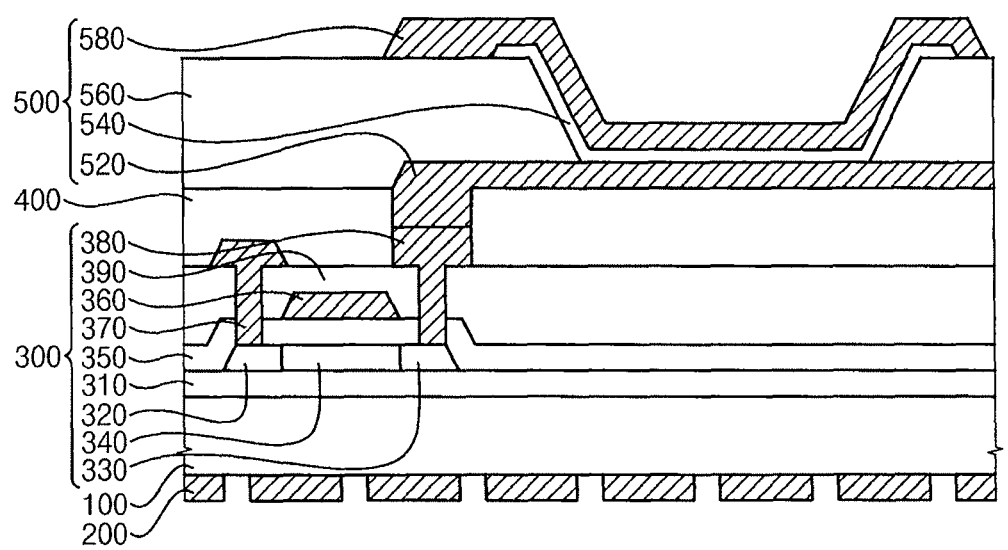

As illustrated in FIG. 8C, the method of FIG. 7 may form a planarization layer 400 to cover the switching element 300 and to flatten the upper surface of the first substrate 100. The method of FIG. 7 may form the display element 500 on the planarization layer 400. The planarization layer 400 may be formed by a deposition, a coating process, a printing process, or the like, using a transparent material such as a transparent plastic, a transparent resin, or the like. For example, the planarization layer 400 may be planarized by a chemical mechanical polishing or an etch-back process. For example, the planarization layer 400 may be formed by using a material having a self planarizing property.

After forming a hole exposing a portion of the drain electrode 380 of the switching element 300, in the planarization layer 400, the display element 500 electrically connected to the switching element 300 through the hole may be formed. For example, when the display element 500 includes an organic light emitting diode, a first electrode 520 may be formed by a sputtering process, a deposition, a printing process, or the like, using a metal or a transparent conductive material. The pixel definition layer 560 may be formed by using a transparent material including a transparent resin or a transparent plastic. The pixel definition layer 560 may be formed by a deposition, a coating process, or a printing process, for example. After forming an opening exposing a portion of the first electrode 520 in the pixel definition layer 560, the organic light emitting layer 540 may be formed in the opening. The organic light emitting layer 540 may be formed by a deposition, a mask sputtering, a printing process, a spin coating process, or the like. A second electrode 580 to cover the organic light emitting layer 540 may be formed with a transparent conductive material of a metal. The second electrode 580 may be formed by a sputtering process, a deposition, a printing process, for example.

Figure 8D:
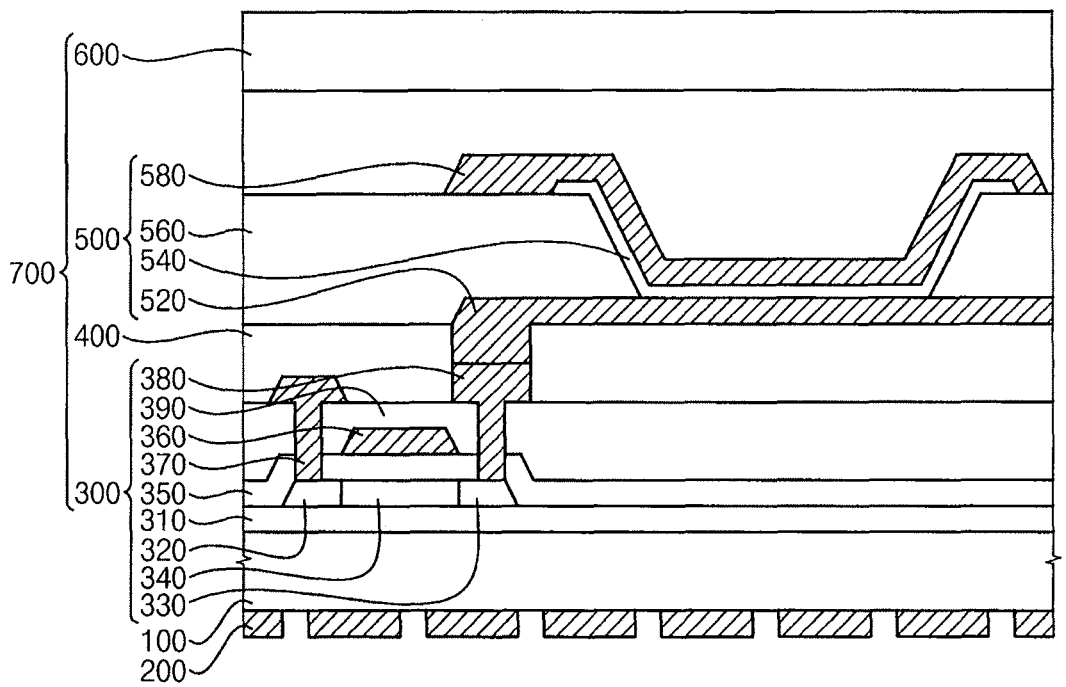

As illustrated in FIG. 8D, the method of FIG. 7 may encapsulate the switching element 300 and the display element 500 by covering a second substrate 600 on the first substrate 100, and adhering the second substrate 600 to the first substrate 100 by using a sealing material. For example, the sealing material may be an inorganic material such as a fit. The encapsulating may be performed by spreading the sealing material on an upper surface of the first substrate 100 or a lower surface of the second substrate 600, and by hardening the sealing material using a laser or an ultraviolet ray.

Figure 9:
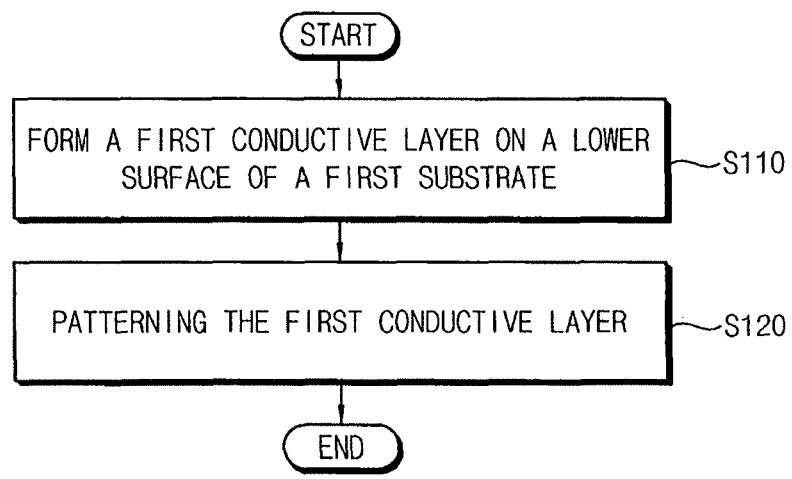
FIG. 9 is a flow chart of an example of forming a first conductive pattern layer by the method of FIG. 7.

FIG. 9 illustrates a flow chart illustrating an example of forming a first conductive pattern layer by the method of FIG. 7. FIGS. 10A through 10D illustrate cross-sectional views illustrating an example of forming a first conductive pattern layer by the method of FIG. 7. Referring to FIG. 9 and FIGS. 10A through 10D, the method of FIG. 7 may form a first conductive layer 210 on a lower surface of the first substrate 100 (S110), and may form a first conductive pattern layer 200 by patterning the first conductive layer 210 based on a predetermined shape (S120).

Figure 10A:
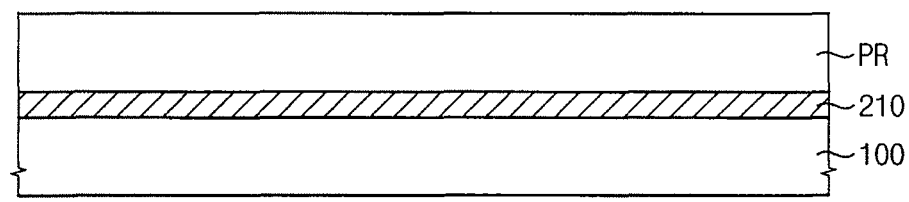
FIGS. 10A through 10D illustrate cross-sectional views of an example of forming a first conductive pattern layer by the method of FIG. 7.

As illustrated in FIG. 10A, the method of FIG. 7 may form the first conductive layer 210 to cover the lower surface of the first substrate 100. The first conductive layer 210 may be formed, for example, with a metal, a transparent conductive material, a conductive polymer, a metal nanowire, or a combination thereof. The first conductive layer 210 may be formed, for example, by a deposition, a sputtering process, a spray process, an atomic layer deposition (ALD), or the like. The deposition may include a chemical vapor deposition (CVD), a plasma enhanced CVD (PECVD), a high-density plasma CVD (HDP-CVD), a pursed laser deposition (PLD), or the like. After forming the first conductive layer 210, the photoresist PR may be applied on the first conductive layer 210. For example, the photoresist PR may be spread as a liquid on the first conductive layer 210.

Figure 10B:
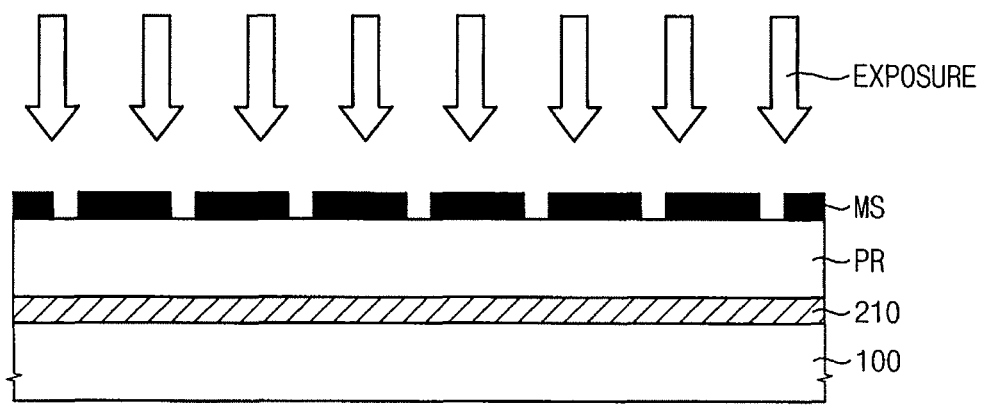
Figure 10C:
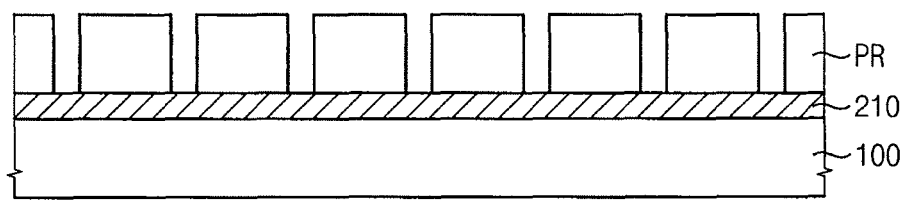

As illustrated in FIG. 10B, the method of FIG. 7 may expose the photoresist PR, after disposing a mask MS to form a first conductive pattern layer 200 on the photoresist PR. For example, the exposure may be performed by using an ultraviolet ray. As illustrated in FIG. 10C, the method of FIG. 7 may form a photoresist PR pattern that is substantially identical pattern to the first conductive pattern layer 200, by developing the photoresist PR. In this case, the photoresist PR pattern may have different shape according to a type of the photoresist PR. When the photoresist PR is a positive photoresist, for example, an exposed portion may be eliminated by developing, as illustrated in FIG. 10C. When the photoresist PR is a negative photoresist, for example, the exposed portion may be retained by developing.

Figure 10D:
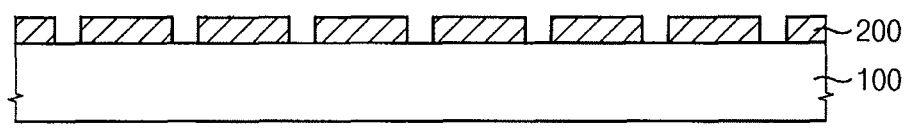

As illustrated in FIG. 10D, the method of FIG. 7 may finally form the first conductive pattern layer 200 by etching for partially eliminating the first conductive layer 210, after heating treatment for improving an adhesion of the photoresist PR. The first conductive pattern layer 200 may be formed by wet etching using an etchant including an ammonium peroxodisulfate (($NH_4$)$_2$$S_2$$O_8$) or a hydrofluoric acid (HF), for example. In some implementations, the first conductive pattern layer 200 may be formed by dry etching using an ion-beam or a plasma.

Figure 11:
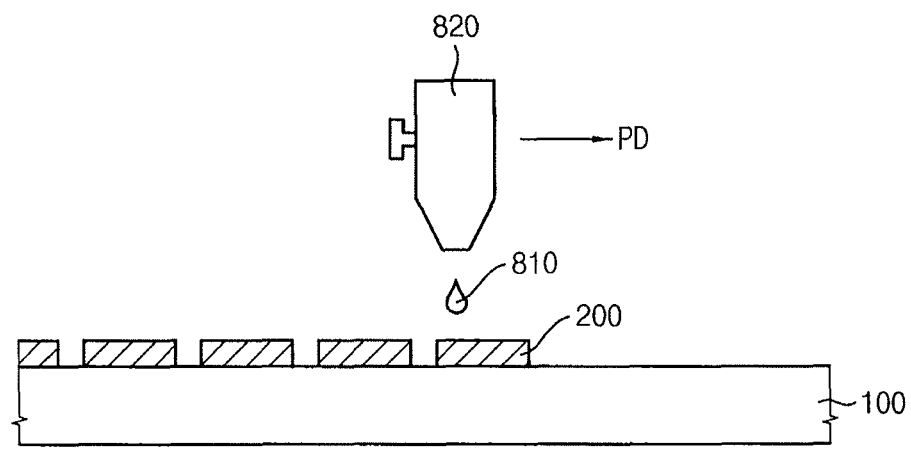
FIG. 11 illustrates a cross-sectional view of another example of forming a first conductive pattern layer by the method of FIG. 7.

FIG. 11 illustrates a cross-sectional view illustrating another example of forming a first conductive pattern layer by the method of FIG. 7. Referring to FIG. 11, the method of FIG. 7 may form the first conductive pattern layer 200 by a printing process having a print direction (PD). That is, the first conductive pattern layer 200 may be directly formed on the lower surface of the first substrate 100 to have a predetermined pattern shape by using a metal, a transparent conductive material, a conductive polymer, a metal nanowire, or a combination thereof. The printing process may include an ink-jet printing process, a laser-induced thermal imaging process, a micro-contact printing process, an aerosol jet printing process, a screen printing process, or the like.

The method of FIG. 7 may, for example, form the first conductive pattern layer 200 by an ink-jet printing process. The ink-jet printing process may be one of various methods of forming a pattern layer by directly spraying a conductive material 810 through a nozzle 820 onto the lower surface of the first substrate 100. According to the ink-jet printing process, the first conductive pattern layer 200 may be formed without an additional patterning procedure. The method of FIG. 7 may form the first conductive pattern layer 200 by a laser-induced thermal imaging process. The method of FIG. 7 may transform a laser into a thermal energy by radiating the laser to a heat conversion layer, and the method of FIG. 7 may induce a conductive material onto the first substrate 100 using the energy induced by the laser, to form the first conductive pattern layer 200. According to the laser-induced thermal imaging process, the first conductive pattern layer 200 may be formed faster and more stable than the ink-jet printing process.

The method of FIG. 7 may omit a process of forming an additional static protective device for protecting the display panel from the static electricity. The method of FIG. 7 may simplify the process. Thus, the method of FIG. 7 may improve productivity of the display panel. The method of FIG. 7 may reduce manufacturing costs of the display panel. The first conductive pattern layer 200 that can absorb and discharge the static electricity may be easily formed by a simple method mentioned herein. Therefore, the process for manufacturing the display panel may be simplified.

Figure 12:
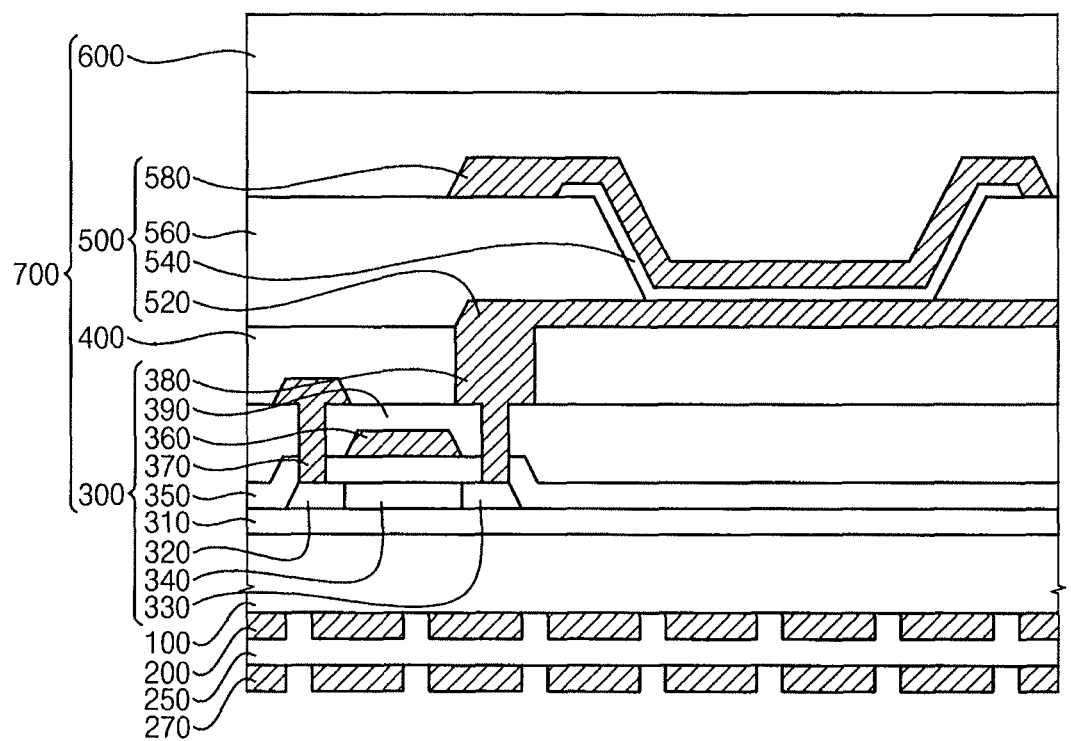
FIG. 12 illustrates a cross-sectional view of a display panel.

FIG. 12 illustrates a cross-sectional view illustrating a display panel. Referring to FIG. 12, the display panel 20 may include a first substrate 100, a first conductive pattern layer 200 on a lower surface of the first substrate 100, an insulating layer 250 covering the first conductive pattern layer 200, a second conductive pattern layer 270 on a lower surface of the first conductive pattern layer 200, and an upper structure on an upper surface of the first substrate 100. Elements of the display panel 20 except for the first conductive pattern layer 200, the insulating layer 250, and the second conductive pattern layer 270 may be substantially identical to corresponding elements of the display panel 10 of FIG. 1.

The first conductive pattern layer 200 may be on a lower surface of the first substrate 100 of the display panel 20. The first conductive pattern layer 200 may prevent the display panel 20 from being damaged by a static electricity. For example, the first conductive pattern layer 200 may include a conductive material, and the first conductive pattern layer 200 may protect the upper structure 700 by absorbing the static electricity and by discharging the static electricity. The first conductive pattern layer 200 may have a predetermined pattern shape in order to efficiently absorb and discharge the static electricity. A pattern shape of the first conductive pattern layer 200 may be illustrated in FIGS. 2 through 6, and detailed descriptions of the pattern shape. The first conductive pattern layer 200 may include, for example, a metal, a transparent conductive material, a conductive polymer, a metal nanowire or a combination thereof. The first conductive pattern layer 200 may be substantially identical to the first conductive pattern layer 200 of display panel 10 according to FIG. 1.

The insulating layer 250 to cover the first conductive pattern layer 200 may be on a lower surface of the first conductive pattern layer 200. The insulating layer 250 may include an oxide, a nitride, an oxynitride, an organic insulation material, or the like. For example, the insulating layer 250 may include a silicon oxide, a hafnium oxide ($HfO_x$), an aluminum oxide, a zirconium oxide ($ZrO_x$), a titanium oxide ($TiO_x$), a tantalum oxide ($TaO_x$), a benzo-cyclo-butene-based resin, an acryl-based resin. The insulating layer 250 may have a mono-layered structure or a multi-layered structure including the oxide, the nitride, the oxynitride or the organic insulation material.

The second conductive pattern layer 270 may be on the lower surface of the first conductive pattern layer 200. The second conductive pattern layer 270 may be on a lower surface of the insulating layer 250 covering the first conductive pattern layer 200. The second conductive pattern layer 270 may be electrically insulated with the first conductive pattern layer 200. The second conductive pattern layer 270 may have substantially the similar pattern shape to the first conductive pattern layer 200. The pattern shape of the second conductive pattern layer 270 may be substantially similar to the pattern shape of the first conductive pattern layer 220, 240, 260, 280 and 290 of FIGS. 2 through 6. For example, the second conductive pattern layer 270 may include a quadrangular pattern, a circular pattern, a linear pattern, a dot pattern or a lattice pattern.

The first conductive pattern layer 200 and the second conductive pattern layer 270 may include substantially identical patterns. The first conductive pattern layer 200 and the second conductive pattern layer 270 may include substantially different patterns. When the second conductive pattern layer 270 is on the lower surface of the insulating layer 250, for example, the second conductive pattern layer 270 may partially cover the insulating layer 250. A height difference between the portion in which patterns of the second conductive pattern layer 270 are positioned and an exposing portion in which the patterns are not positioned exists, and the static electricity may be absorbed efficiently by the height difference. The second conductive pattern layer 270 may have a various cross-section shape. For example, the second conductive pattern layer 270 may have a quadrangular cross-section shape as illustrated in FIG. 12. The second conductive pattern layer 270 may have a semicircular cross-section shape, a triangular cross-section shape, a trapezoidal cross-section shape, or the like. For example, when the second conductive pattern layer has a sharp triangular cross-section shape, the static electricity may be easily concentrated on a vertex of the sharp triangle. The static electricity may be easily absorbed by the second conductive pattern layer 270. The second conductive pattern layer 270 may include a metal, a transparent conductive material, a conductive polymer, a metal nanowire or a combination thereof, for example.

The display panel 20 can prevent the static electricity more efficiently by including a double-layered conductive pattern layer that can absorb and discharge the static electricity. The display panel 20 may reduce being damaged by a static electricity more completely. In other implementations, the display panel 20 may be manufactured by substantially the similar method of manufacturing the display panel 10 that was described with referring to FIG. 7 and FIGS. 8A through 8D. For example, the method of manufacturing the display panel 20 may form the second conductive pattern layer 270 by substantially identical or similar method of FIGS. 9 through 11. For example, a method of manufacturing the display panel 20 may form an insulating layer 250 by a deposition, a coating process, a printing process, or the like, using an oxide, a nitride, an oxynitride or an organic insulating material, and the method of manufacturing the display panel 20 may form the second conductive pattern layer 270 on a lower surface of the insulating layer 250. For example, the method may form a second conductive layer on the lower surface of the insulating layer 250 by a deposition, a sputtering, a spray process, an atomic layer deposition, or the like, using a metal, a transparent material, a conductive polymer, a metal nanowire or a combination thereof, and the method may finally form the second conductive pattern layer 270 by patterning the second conductive layer to a predetermined pattern shape. For example, the method of manufacturing the display panel 20 may form the second conductive pattern layer 270 by an ink-jet printing process, a laser-induced thermal imaging process, a micro-contact printing process, an aerosol jet printing process, a screen printing process, or the like.

The present embodiments may be applied to any display panel that can be damaged by the static electricity input from outside. For example, the present embodiments may be applied to a display panel of an organic light emitting display device, a display panel of a liquid crystal display device, a display panel of a plasma display device, a display panel of an electrophoretic display device, or the like. The display panel may have improved durability against a static electricity without using any additional static protective device. A method of manufacturing a display panel having durability against a static electricity without any additional static protective device is also provided.

By way of summation and review, a display panel may have improved durability against a static electricity input from outside by including a conductive pattern layer having a predetermined pattern shape that can effectively absorb and discharge the static electricity. A method of manufacturing the display panel according to example embodiments may improve productivity of the display panel, and may reduce manufacturing costs of the display panel by simplifying a process (e.g., by omitting a process for forming an additional static protective device).

Generally, to prevent the internal elements of the display panel from being damaged by the static electricity, an additional static protective device for protecting the internal elements of the display panel from the static electricity may be located in the display panel, and/or an ionizing device for discharging the static electricity may be in the display panel. However, the additional static protective device and the ionizing device may have low efficiency for eliminating the static electricity. In addition, the additional static protective device and the ionizing device may use an additional space on which the additional static protective device and the ionizing device are in the display panel. Further, the additional static protective device may use an additional wire to connect the internal elements of the display panel to the additional static protective device. In case of a large-size display panel, because it includes a plurality of internal elements that are sensitive to the static electricity, a quantity of the additional static protective device is increased. Accordingly, a productivity of the display panel may be reduced.

The foregoing is illustrative of example embodiments and is not to be construed as limiting thereof. Although a few example embodiments have been described, those skilled in the art will readily appreciate that many modifications are possible in the example embodiments without materially departing from the teachings and advantages. Accordingly, all such modifications are intended to be included within the scope of the disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present disclosure as set forth in the following claims.

What is claimed is:

1. A display panel, comprising:
a first substrate including an upper surface and a lower surface on opposite sides of the first substrate, the upper and lower surfaces facing away from each other;
an upper structure on the upper surface of the first substrate; and
a first conductive pattern layer on the lower surface of the first substrate, the first conductive pattern layer configured to absorb and discharge static electricity input from outside the display panel, the first conductive pattern layer including a plurality of openings therein.

2. The panel as claimed in claim 1, wherein the upper structure includes a plurality of organic light emitting devices.

3. The panel as claimed in claim 1, wherein the first conductive pattern layer includes a metal.

4. The panel as claimed in claim 1, wherein the first conductive pattern layer includes a transparent conductive material.

5. The panel as claimed in claim 1, wherein the first conductive pattern layer includes a conductive polymer.

6. The panel as claimed in claim 1, wherein the first conductive pattern layer includes a metal nanowire.

7. The panel as claimed in claim 1, wherein the first conductive pattern layer includes a plurality of concentric polygonal patterns that are separate from each other.

8. The panel as claimed in claim 1, wherein the first conductive pattern layer includes a plurality of concentric circular patterns that are separate from each other.

9. The panel as claimed in claim 1, wherein the first conductive pattern layer includes a plurality of linear patterns that are separate from each other.

10. The panel as claimed in claim 1, wherein the first conductive pattern layer includes a plurality of dot patterns that are separate from each other.

11. The panel as claimed in claim 1, wherein the first conductive pattern layer includes at least one lattice pattern including a plurality of first linear patterns arranged in a first direction and a plurality of second linear patterns arranged in a second direction.

12. The panel as claimed in claim 1, further comprising:
a second conductive pattern layer on a lower surface of the first conductive pattern layer, the second conductive pattern layer configured to absorb and discharge static electricity; and
an insulating layer between the first conductive pattern layer and the second conductive pattern layer, the insulating layer configured to electrically insulate the first conductive pattern layer and the second conductive pattern layer from each other.

13. The panel as claimed in claim 12, wherein the first conductive pattern layer and the second conductive pattern layer include identical patterns.

14. The panel as claimed in claim 12, wherein the first conductive pattern layer and the second conductive pattern layer include different patterns.

15. A method of manufacturing a display panel, the method comprising:
forming a first conductive pattern layer on a lower surface of a first substrate, the first conductive pattern layer configured to absorb and discharge a static electricity input from outside the display panel, the first conductive pattern layer being formed with a plurality of openings therein; and
forming an upper structure on an upper surface of the first substrate, the upper and lower surfaces being on opposite sides of the first substrate, the upper and lower surfaces facing away from each other.

16. The method as claimed in claim 15, wherein forming the first conductive pattern layer includes:
forming a first conductive layer on the lower surface of the first substrate; and
patterning the first conductive layer.

17. The method as claimed in claim 15, wherein the first conductive pattern layer is formed by a printing process using a first conductive material.

18. The method as claimed in claim 15, further comprising:
forming an insulating layer on a lower surface of the first conductive pattern layer; and
forming a second conductive pattern layer, the second conductive pattern layer configured to absorb and discharge static electricity.

19. The method as claimed in claim 18, wherein forming the second conductive pattern layer includes:
forming a second conductive layer on a lower surface of the insulating layer; and
patterning the second conductive layer.

20. The method as claimed in claim 18, wherein the second conductive pattern layer is formed by a printing process using a second conductive material.

* * * * *